United States Patent [19]

Tanaka

[11] Patent Number: 5,164,684
[45] Date of Patent: Nov. 17, 1992

[54] PHASED-LOCKED OSCILLATION CIRCUIT SYSTEM WITH MEASURE AGAINST SHUT-OFF OF INPUT CLOCK

[75] Inventor: Hironao Tanaka, Tokyo, Japan
[73] Assignee: NEC Corporation, Tokyo, Japan
[21] Appl. No.: 769,682
[22] Filed: Oct. 2, 1991
[30] Foreign Application Priority Data
  Oct. 2, 1990 [JP] Japan .................................. 2-263093
[51] Int. Cl.⁵ .......................... H03L 7/14; H03L 7/18
[52] U.S. Cl. ....................................... 331/1 A; 331/14; 331/25; 331/27
[58] Field of Search ...................... 331/1 A, 14, 25, 27

[56] References Cited
U.S. PATENT DOCUMENTS 3,882,412  5/1975  Apple, Jr. ........................... 331/1 A
4,135,166  1/1979  Marchetti .............................. 331/14
4,633,193  12/1986  Scordo ............................... 331/1 A Primary Examiner—Siegfried H. Grimm
Attorney, Agent, or Firm—Sughrue, Mion, Zinn, Macpeak & Seas

[57] ABSTRACT

A phase-locked oscillation circuit system for dividing a clock whose frequency is an integral multiple of a signal produced by dividing the frequency of an input clock. While the input clock to the circuit is shut off, a phase comparator included in the circuit is supplied with a reference signal which is the signal being applied to the compare input of the comparator and the timing of which is modified by a small amount. The system protects the output of a voltage controlled oscillator and, therefore, the output clock of a phase-locked oscillation circuit thereof against disturbances ascribable to the shut-off and recovery of an input clock.

1 Claim, 6 Drawing Sheets

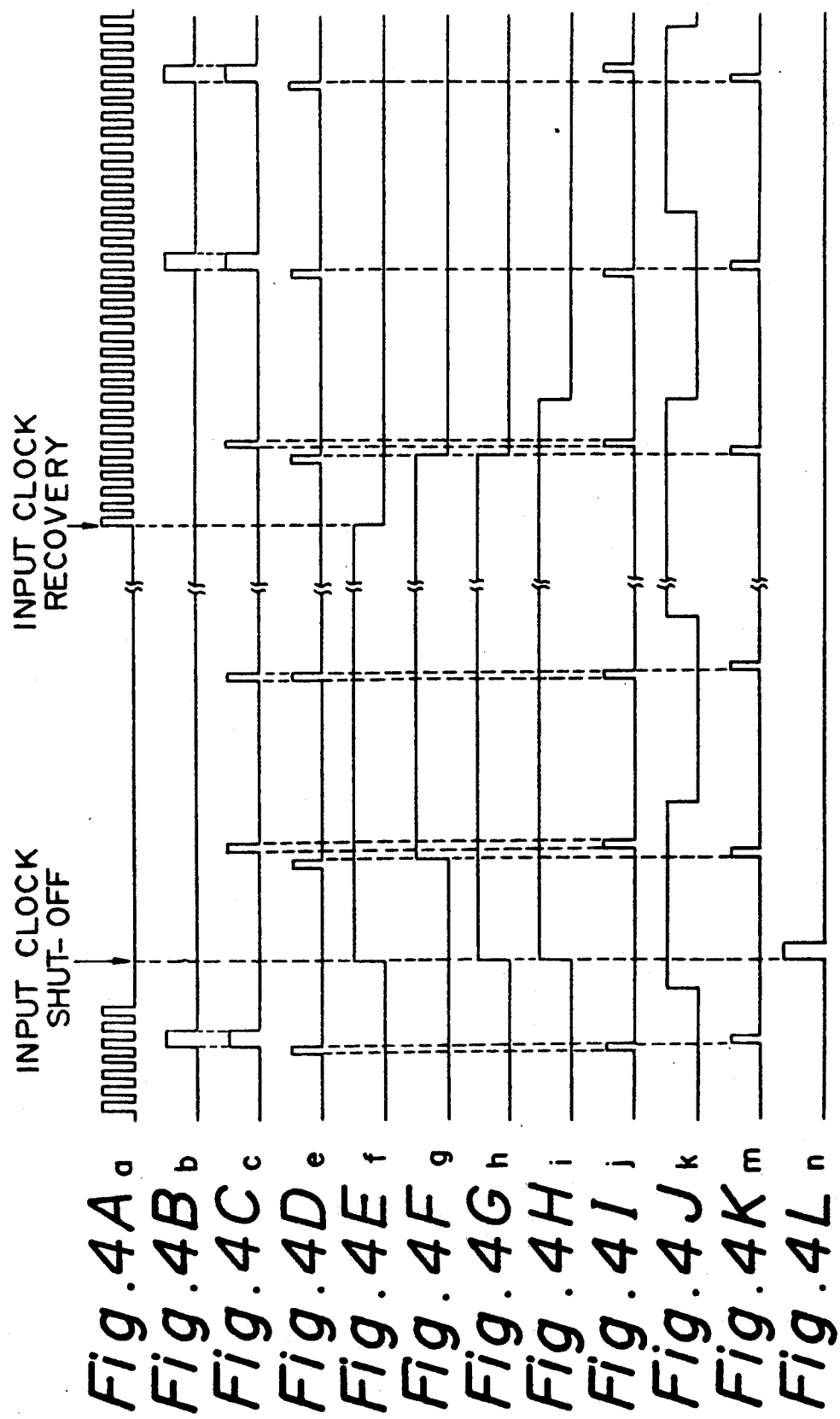

PHASED-LOCKED OSCILLATION CIRCUIT SYSTEM WITH MEASURE AGAINST SHUT-OFF OF INPUT CLOCK

BACKGROUND OF THE INVENTION

The present invention relates to a phase-locked oscillation circuit system for producing a clock whose frequency is an integral multiple of the frequency of a signal produced by dividing the frequency of an input clock.

A conventional phase-locked oscillation circuit system is made up of two phase-locked oscillation circuits and which are interconnected in two stages. The oscillation circuits each has a phase comparator, a loop filter, a voltage controlled oscillator (VCO), and two frequency dividers. In this kind of circuit system, the loop filter of the first stage is provided with an extremely great time constant. Hence, even when the clock being inputted to the circuitry via an input terminal is shut off, the output of the first stage does not sharply change and, therefore, prevents the clock being outputted via an output terminal from undergoing a noticeable change.

Another conventional phase-locked oscillation circuit system has a switch, a frequency division timing control circuit, a constant voltage source, and a clock shut-off detector in addition to a phase-locked oscillation circuit which is made up of a phase comparator, a loop filter, a VCO, and two frequency dividers. In such a configuration, when the clock shut-off detector detects the shut-off of the input clock, the switch is so controlled as to connect the input of the VCO to the constant voltage source. As a result, the clock frequency appearing on an output terminal is maintained constant. After the input clock has been recovered, the frequency division timing control circuit delivers the output of one of the frequency dividers to the other frequency divider only once to thereby coincide with each phase of the input signal to the phase comparator. At the same time, the switch is operated again to connect the input of the VCO to the loop filter, reestablishing lock rapidly.

The problem with the two-stage oscillation circuit scheme is that since the time constant of the loop filter is great, the interval between the time when the phase comparator is brought out of lock and the time when it regains lock is extremely long. The single-stage oscillation circuit scheme is not satisfactory for the following reason. Specifically, though the output clock frequency is fixed while the input clock is shut off, the output frequency is seldom the same before and after the shut-off. Then, the clock appearing on the output terminal fluctuates when the input clock is shut off and recovered.

SUMMARY OF THE INVENTION

It is, therefore, an object of the present invention to provide a phase-locked oscillation circuit system which outputs a clock of desired frequency in response to a clock including jitter and wander and can reduce the fluctuation of the output frequency thereof even when the input clock is shut off and then recovered.

It is another object of the present invention to provide a generally improved phase-locked oscillation circuit system with a measure against the shut-off of an input clock.

In accordance with the present invention, a phase-locked oscillation circuit system having a phase comparator, a loop filter, a VCO and a frequency divider for outputting a clock whose frequency is an integral multiple of the frequency of a signal produced by dividing an input clock has a clock shut-off detector for detecting the shut-off of the input clock. Means is provided for delaying a first signal produced by dividing the frequency of the output of the VCO to a phase comparison frequency by a single delay element to thereby produce a second signal and delaying the first signal by two successive delay elements to produce a third signal, inputting, while the clock shut-off detector does not detect the shut-off of the input signal, a frequency divided signal of the input clock to the reference signal input of the phase comparator, and inputting, while the clock shut-off detector detects the shut-off, the first signal and third signal alternately to the reference signal input of the phase comparator, thereby feeding a pseudo reference signal to the phase comparator while the clock shut-off detector detects the shut-off. Also, means is provided for initializing, when the clock shut-off detector detects the recovery of the input clock, a frequency divider to which the input clock is applied by using the timing of the first signal, thereby forcibly causing the phase of the frequency divided signal of the input clock to coincide with the phase of the first signal.

BRIEF DESCRIPTION OF THE DRAWINGS

The above and other objects, features and advantages of the present invention will become more apparent from the following detailed description taken with the accompanying drawings in which:

FIGS. 4A-4L are timing charts showing signals appearing in various sections of the embodiment.

DESCRIPTION OF THE PREFERRED EMBODIMENT

Figure 1:
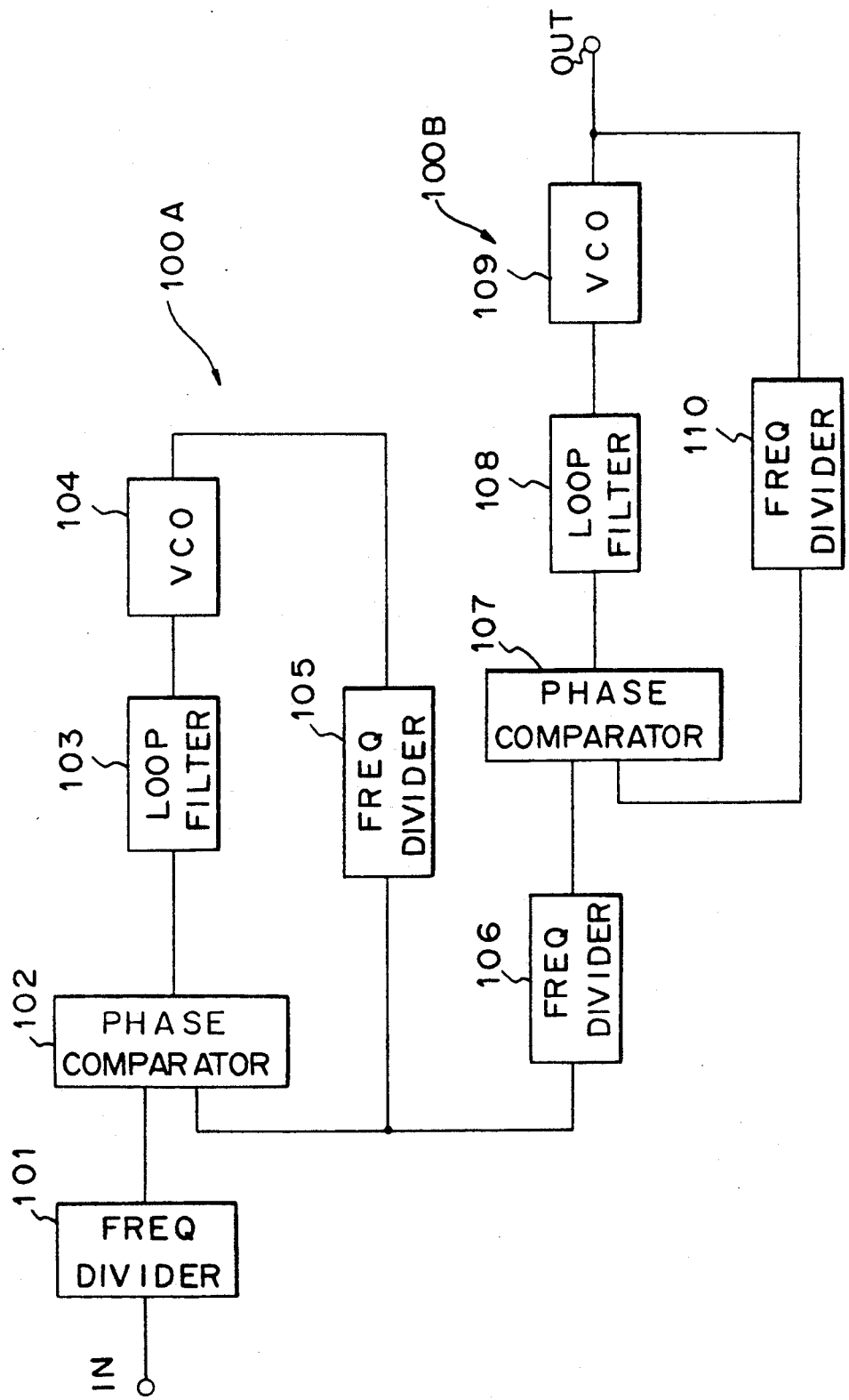
FIGS. 1 and 2 are block diagrams each showing a specific construction of a conventional phase-locked oscillation circuit system.

To better understand the present invention, a brief reference will be made to a prior art phase-locked oscillation circuit system, shown in FIG. 1. As shown, the conventional circuit system is made up of two phase-locked oscillation circuits 100A and 100B which are interconnected in two stages. The oscillation circuits 100A and 100B comprise respectively phase comparators 102 and 107, loop filters 103 and 108, VCOs 104 and 109, frequency dividers 101 and 106, and frequency dividers 105 and 110. The loop filter 103 is provided with an extremely great time constant. Hence, even when the clock being inputted to the circuitry via an input terminal IN is shut off, the output of the frequency divider 105 does not sharply change and, therefore, prevents the clock being outputted via an output terminal OUT from undergoing a noticeable change.

Figure 2:
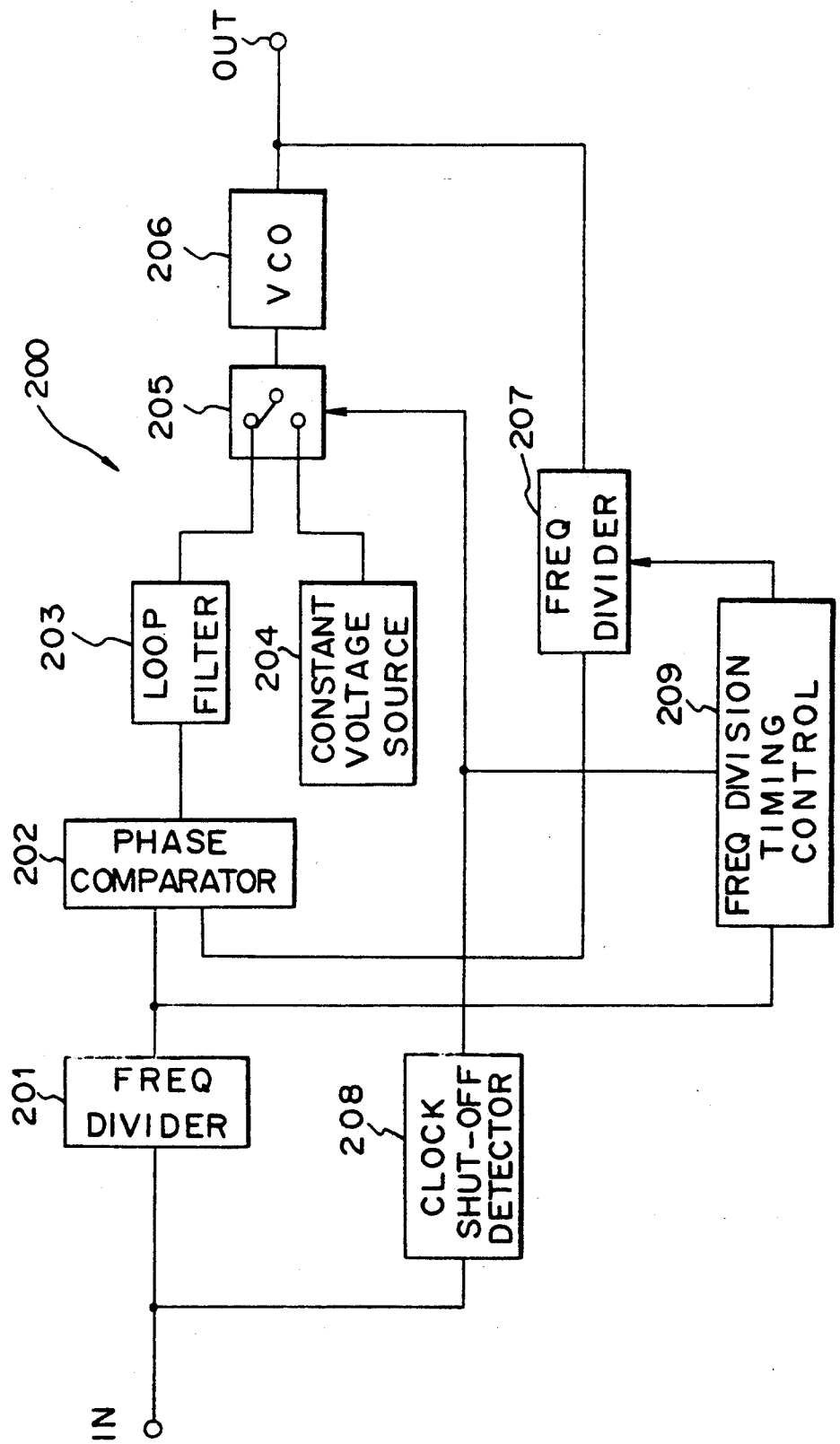

FIG. 2 shows another conventional phase-locked oscillation circuit system. As shown, this oscillation circuit has a switch 205, a constant voltage source 204, a clock shut-off detector 208, and a frequency division timing control circuit 209 in addition to a phase-locked oscillation circuit 200 which is made up of a phase comparator 202, a loop filter 203, a VCO 206, and frequency dividers 201 and 207. When the clock shut-off detector 208 detects the shut-off of the input clock, the switch 205 is so controlled as to connect the input of the VCO 206 to the constant voltage source 204. As a result, the clock frequency appearing on an output terminal OUT is maintained constant. After the input clock has been recovered, the frequency division timing control circuit 209 delivers the output of the frequency divider 201 to the frequency divider 207 only once to thereby coincide with each phase of the input signal to the phase comparator 202. At the same time, the switch 205 is operated again to connect the input of the VCO 206 to the loop filter 203, reestablishing lock rapidly.

The problem with the circuitry of FIG. 1 is that since the time constant of the loop filter 103 is great, the interval between the time when the phase comparator 102 is brought out of lock and the time when it regains lock is extremely long, as discussed earlier. The circuitry of FIG. 2 is not satisfactory for the following reason. Specifically, though the output clock frequency is fixed while the input clock is shut off, the output frequency is seldom the same before and after the shut-off. Then, the clock appearing on the output terminal OUT fluctuates when the input clock is shut off and recovered.

Figure 3A:
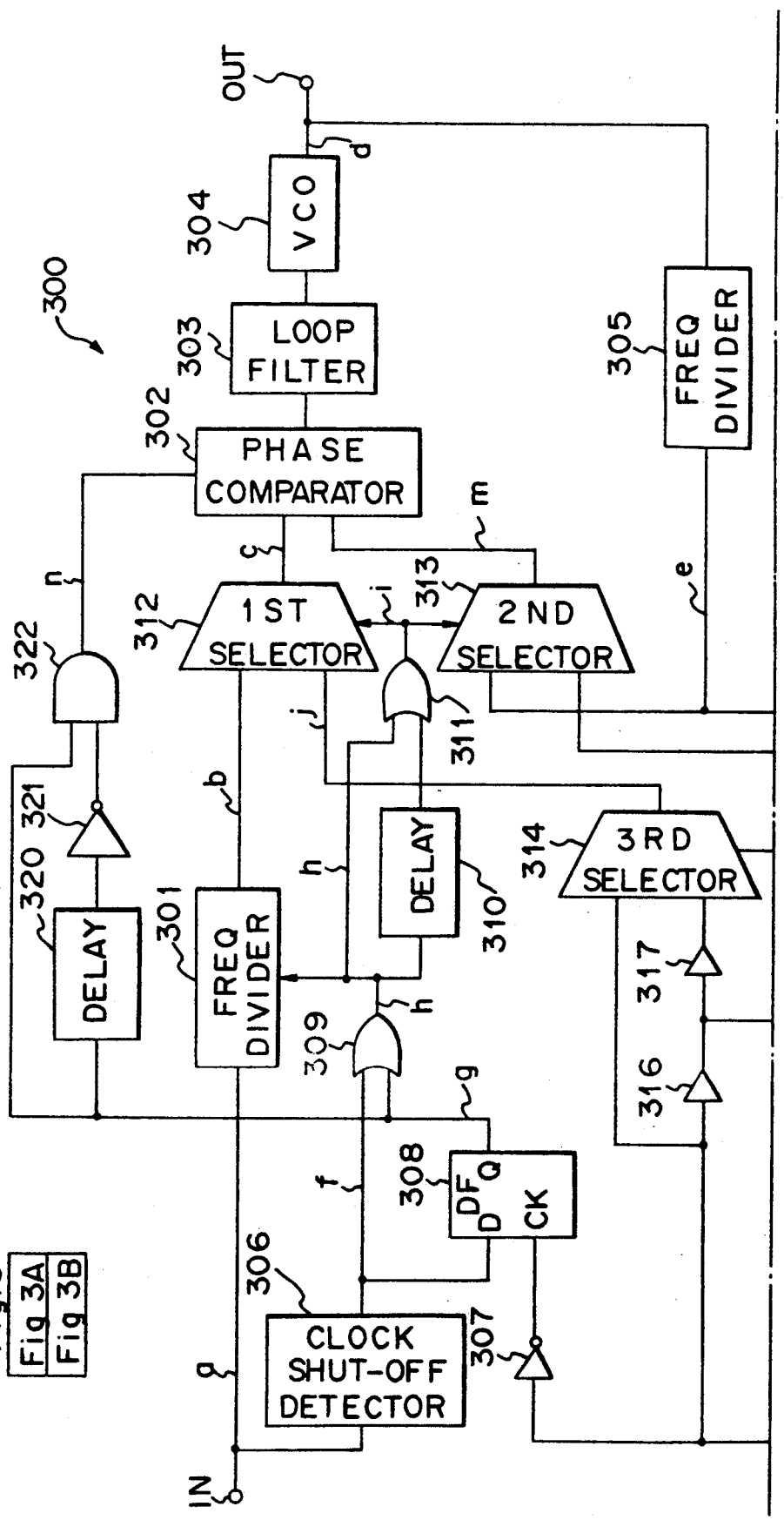
FIG. 3, consisting of FIGS. 3A and 3B, is a block diagram schematically showing a phase-locked oscillation circuit system embodying the present invention.
Figure 3B:
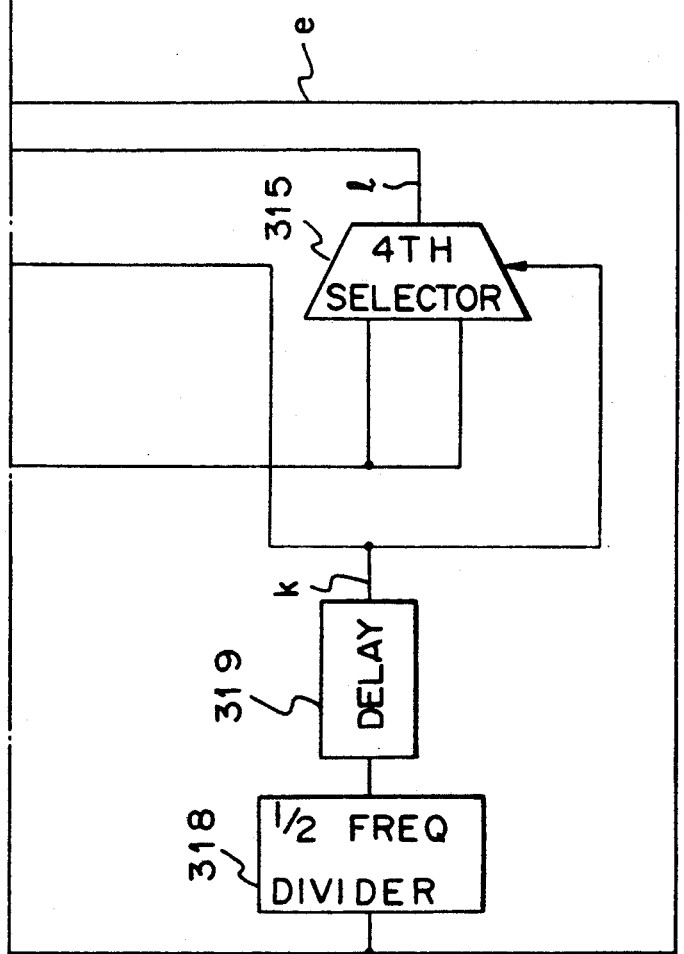

Referring to FIG. 3, a phase-locked oscillation circuit system with a measure against the shut-off of an input clock embodying the present invention will be described. As shown, the circuit system, generally 300, has a frequency divider 301 to which an input or reference clock a is applied via an input terminal IN. A phase comparator 302 compares the phase of a reference signal c and the phase of a compare signal m which are selected by a first and a second selector 312 and 313, respectively. The output of the phase comparator 302 is connected to a loop filter 303 the output of which is in turn connected to a VCO 304. A frequency divider 305 divides the output frequency of the VCO 304. A clock shut-off detector 306 detects the shut-off of the input clock a. A D type flip-flop (DF) 308 has a clock input CK for receiving the output of an inverter 307 and a data input D for receiving a detection signal f from the clock shut-off detector 306. A delay circuit 310 delays the output signal h of an OR gate 309. An OR gate 311 ORs the delayed signal from the delay circuit 310 and the output signal of the OR gate 309. The output signal i of the OR gate 311 is fed to the first and second selectors 312 and 313 as a selection signal. A third selector 314 selects either one of the output signal e of the frequency divider 305 and a signal produced by delaying the signal e by two successive delay elements 316 and 317. Further, the signal delayed by the delay element 316 is applied to a fourth selector 315. The signal e from the frequency divider 305 is routed through a ½ frequency divider 318 and a delay circuit 319 to produce a signal k. This signal k is applied to the third and fourth selectors 314 and 315 as a selection signal. The output signal g of the D type flip-flop 308 is delayed by a delay circuit 320 and then inverted by an inverter 321. The signal g and the output signal of the inverter 321 are fed to an AND gate 322. The resulting AND from the AND gate 322 is inputted to the reset terminal of the phase comparator 302.

Figure 5:
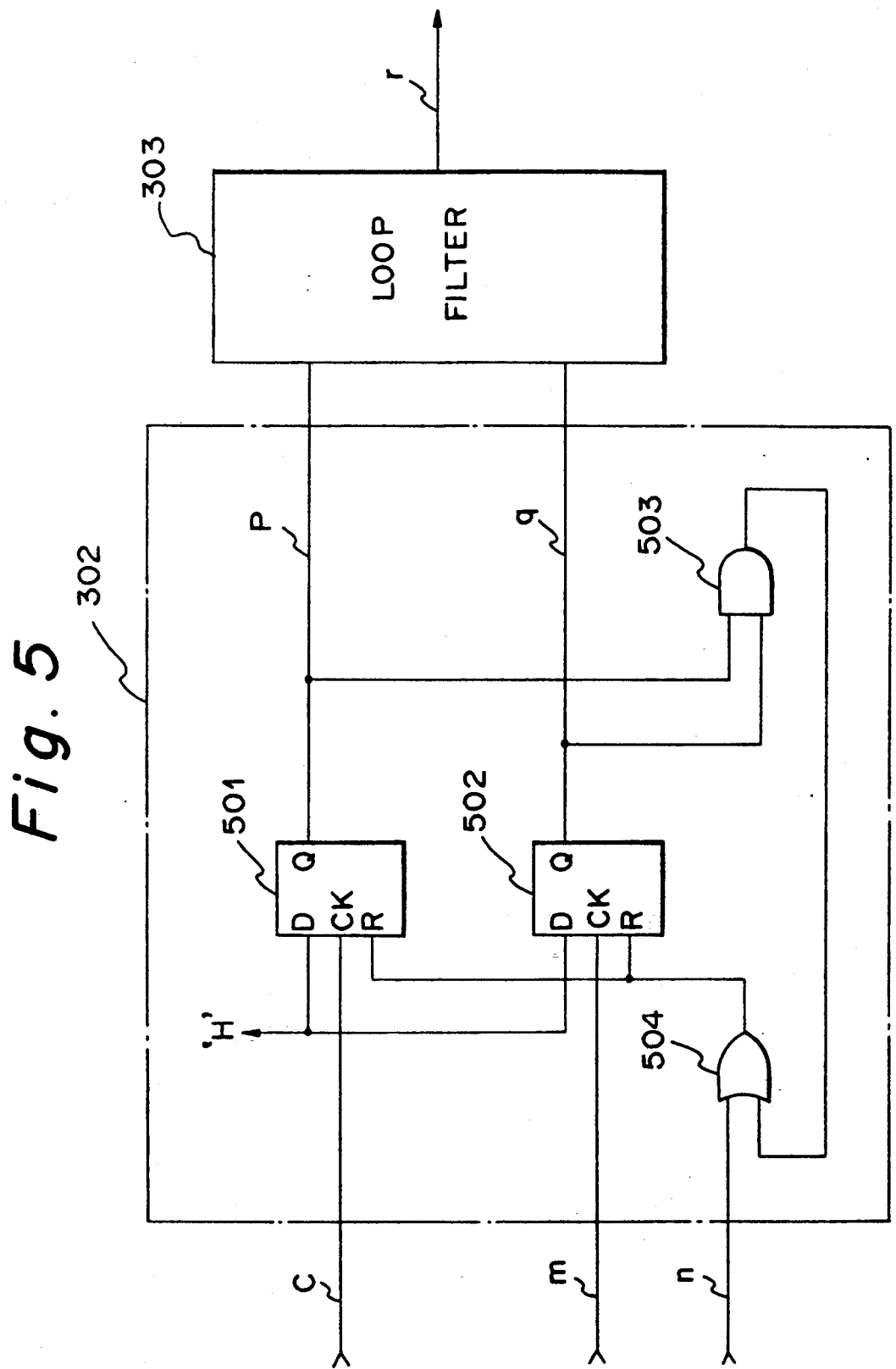
FIG. 5 is a block diagram schematically showing a specific construction of a phase comparator included in the embodiment.

The reference clock a coming in through the input terminal IN is routed through the frequency divider 301 and first selector 312 to the phase comparator 302. As shown in FIG. 5 specifically, the phase comparator 302 has two D type flip-flops 501 and 502, an AND gate 503, and an OR gate 504 and compares the phases of the reference signal c and compare signal m at their positive-going edges. The output of the VCO 304 has the frequency thereof divided by the frequency divider 305 and then applied to the phase comparator 302 via the second selector 313. In practice, the phase comparator 302 and the loop filter 303 are interconnected in the configuration shown in FIG. 5. The phase comparator 302 compares the reference signal c shown in FIG. 4C and selected by the first selector 312 and the compare signal m shown in FIG. 4K and selected by the second selector 313 with respect to phase, delivering the result of comparison as a pulse signal. Specifically, the phase comparator 302 outputs either one of pulse signals p and q, depending on the phase difference. The pulse signal p increases the output voltage r of the loop filter 303 while the pulse signal q reduces it. As the output r of the loop filter 303 in the form of a voltage is applied to the VCO 304, the VCO 304, outputs a clock whose frequency corresponds to the input voltage. The circuit system 300 operates in the above-described manner so long as the input clock a is applied via the input terminal IN.

The operation of the system 300 which occurs on the shut-off of the input clock a will be described with reference to FIGS. 4A-4L. When the clock shut-off detector 306 detects the shut-off of the clock a, the output f of the detector 306 goes high on the elapse of a predetermined period of time, as shown in FIG. 4E. Then, the output signal h of the OR gate 309 also goes high, as shown in FIG. 4G, initializing the frequency divider 301. Subsequently, the output signal i of the AND gate 311 is brought to a high level, as shown in FIG. 4H. As a result, the first selector 312 selects a signal j, FIG. 4I, from the fourth selector 314 while the second selector 313 selects a signal l from the fourth selector 315. It should be noted that the second and fourth selectors 313 and 315 function to set up the same delay times as those of the first and third selectors 312 and 314, rather than to select signals. The signal e, FIG. 4D, from the frequency divider 305 is applied to the D type flip-flop 308 via the inverter 307. In response, the flip-flop 308 latches the high level of the signal f, FIG. 4E, and outputs the signal g, FIG. 4F. Consequently, the timing at which the level of the signal h, FIG. 4G, should change is determined by the output signal e of the frequency divider 305. The signal g and the signal produced by routing the signal g through the delay circuit 320 and inverter 321 are fed to the AND gate 322 which then produces a pulse signal n, FIG. 4L. This pulse signal n is adapted to reset the phase comparator 302 only after the clock shut-off detector 306 has detected the shut-off of the clock a. Should the compare signal be applied to the phase comparator 302 just after the shut-off of the clock a and just before the detection thereof, the phase comparator 302 would fail to continue the comparison of the signals c and m properly.

The third selector 314 receives the output signal e of the frequency divider 305 and the signal which is the signal e having been delayed by the two successive delay elements 316 and 317. On the other hand, the ½ frequency divider 318 and delay circuit 319 produce the signal k, FIG. 4J. As a result, the input signals to the selectors 314 and 315 are selected alternately on the basis of the signal k. The resulting outputs j and l of the selectors 314 and 315 are fed to the selectors 312 and 313, respectively. Hence, while the input clock a is shut off, the selector 312 selects the signal j as the output c thereof. Since the signal j alternately assumes a state which delays the phase relative to the phase of the signal m and a state which advances the former relative to the latter. Consequently, even when the input clock is shut off, the reference signal c, FIG. 4C, and the compare signal m, FIG. 4K, are continuously applied to the phase comparator 302 without interruption. More specifically, despite the shut-off of the clock a, the phases of the reference signal c and compare signal m are the same as before the shut-off, as viewed from the phase comparator 302 side. Therefore, the output frequency of the VCO 304 remains the same even after the shut-off of the clock a.

When the clock shut-off detector 306 detects the recovery of the input clock a after the shut-off, the output signal f thereof, FIG. 4E, goes low. However, the output signal g of the flip-flop 308 goes low in synchronism with the negative-going edge of the signal e from the frequency divider 305, as shown in FIG. 4F. Then, the output signal h of the OR gate 309, which is the OR of the signals f and g, goes low in synchronism with the signal g, as shown in FIG. 4G. On the change of the signal h from the high level to the low level, the frequency divider 301 starts operating by having the initialized state thereof cancelled. Since the signal h from the OR gate 309 is delayed by the delay circuit 310, the selector 312 selects the signal j as the output c thereof only once after the recovery of the input clock a and then selects the signal b. As a result, the reference signal c and compare signal m are continuously applied to the phase comparator 302 even when the input clock a is recovered, preventing the output clock d from being disturbed.

In summary, the present invention protects the output of a VCO of a phase-locked oscillation circuit of the type described, i.e., the output clock of the oscillation circuit against disturbances ascribable to the shut-off and recovery of an input clock. Specifically, while the input clock to the circuit is shut off, a phase comparator included in the circuit is supplied with a reference signal which is the signal being applied to the compare input of the comparator and the timing of which is modified by a small amount.

Various modifications will become possible for those skilled in the art after receiving the teachings of the present disclosure without departing from the scope thereof.

What is claimed is:

1. A phase-locked oscillation circuit system having a phase comparator, a loop filter, a voltage controlled oscillator (VCO) and a frequency divider for outputting a clock whose frequency is an integral multiple of the frequency of a signal produced by dividing an input clock, said system comprising:

clock shut-off detecting means for detecting the shut-off of the input clock;

means for delaying a first signal produced by dividing the frequency of the output of said VCO to a phase comparison frequency by a single delay element to thereby produce a second signal and delaying said first signal by two successive delay elements to produce a third signal, inputting, while said clock shut-off detecting means does not detect the shut-off of said input signal, a frequency divided signal of said input clock to a reference signal input of said phase comparator, and inputting, while said clock shut-off detecting means detects the shut-off, said first signal and said third signal alternately to said reference signal input of said phase comparator, thereby feeding a false reference signal to said phase comparator while said clock shut-off detecting means detects the shut-off; and means for initializing, when said clock shut-off detecting means detects the recovery of the input clock, a frequency divider to which said input clock is applied by using the timing of said first signal, thereby forcibly causing the phase of said frequency divided signal of said input clock to coincide with the phase of said first signal.

* * * * *

UNITED STATES PATENT AND TRADEMARK OFFICE
CERTIFICATE OF CORRECTION

PATENT NO. : 5,164,684
DATED : November 17, 1992
INVENTOR(S) : Hironao Tanaka

It is certified that error appears in the above-indentified patent and that said Letters Patent is hereby corrected as shown below:

Column 4, line 38, change "I" to --1--.

Signed and Sealed this

Thirtieth Day of November, 1993

Attest:

BRUCE LEHMAN

Attesting Officer    Commissioner of Patents and Trademarks